United States Patent [19]

Diamand et al.

[11] 4,066,979
[45] Jan. 3, 1978

[54] NEGATIVE RESISTANCE MICROWAVE CIRCUIT COMPRISING ONE OR MORE PAIRS OF DIODES

[75] Inventors: Felix Diamand; Guy Bourrabier; Robert Antoine, all of Paris, France

[73] Assignee: Thomson-CSF, Paris, France

[21] Appl. No.: 742,878

[22] Filed: Nov. 18, 1976

[30] Foreign Application Priority Data

Nov. 21, 1975 France .................................. 75.35650

[51] Int. Cl.² .............................................. H03B 7/14
[52] U.S. Cl. ...................................... 331/56; 331/101; 331/107 R
[58] Field of Search .................... 331/107 R, 56, 101, 331/99, 96, 107 G, 107 T

[56] References Cited

U.S. PATENT DOCUMENTS

| 3,605,034 | 9/1971 | Rucker | 331/56 |
| 3,662,285 | 5/1972 | Rucker | 331/56 |
| 3,714,605 | 1/1973 | Grace et al. | 331/56 |

*Primary Examiner*—John Kominski
*Attorney, Agent, or Firm*—Oblon, Fisher, Spivak, McClelland & Maier

[57] ABSTRACT

A circuit for microwave oscillators or amplifiers, yielding the maximum microwave power from negative resistance diodes feeding into one and the same waveguide section. Diodes are arranged in pairs symmetrically at the level of one and the same right section of the waveguide but outside the waveguide cavity. In the case where two diodes are used, these are screwed into clamps arranged in chambers opening into the cavity. Cylinders effect impedance matching between waveguides and diodes and are supported mechanically by a shaft which supplies the direct voltage for the circuit.

4 Claims, 4 Drawing Figures

NEGATIVE RESISTANCE MICROWAVE CIRCUIT COMPRISING ONE OR MORE PAIRS OF DIODES

The present invention relates to microwave circuits comprising more than one "negative resistance" type of element, for example GUNN diodes or avalanche diodes. These circuits are designed to operate either as oscillators or as amplifiers.

Those skilled in the art will be aware that it is difficult to connect several negative resistance elements in order to produce the addition of their microwave power, without running into power losses in the form of harmonics or waves generated by parasitic modes.

The invention makes it possible to combine one or more pairs of GUNN diodes or avalanche diodes which inject microwave signals into one and the same straight waveguide section with maximum efficiency on the part of each of the diodes, the heat dissipated within the diodes being readily transferred away by means of a carefully selected arrangement of the thermal masses.

According to the invention, there is provided a negative resistance microwave circuit comprising one waveguide, and at least a pair of chambers with conductive walls forming a symmetrical arrangement in the right section plane of said wave guide, each chamber communicating with said guide and containing means for suppoting and polarizing a negative resistance diode, said polarizing means forming with the walls of each chamber a coxial line portion.

The invention will be better understood and other of its features rendering apparent, from a consideration of the ensuing description and the accompanying drawings in which.

Figure 1:
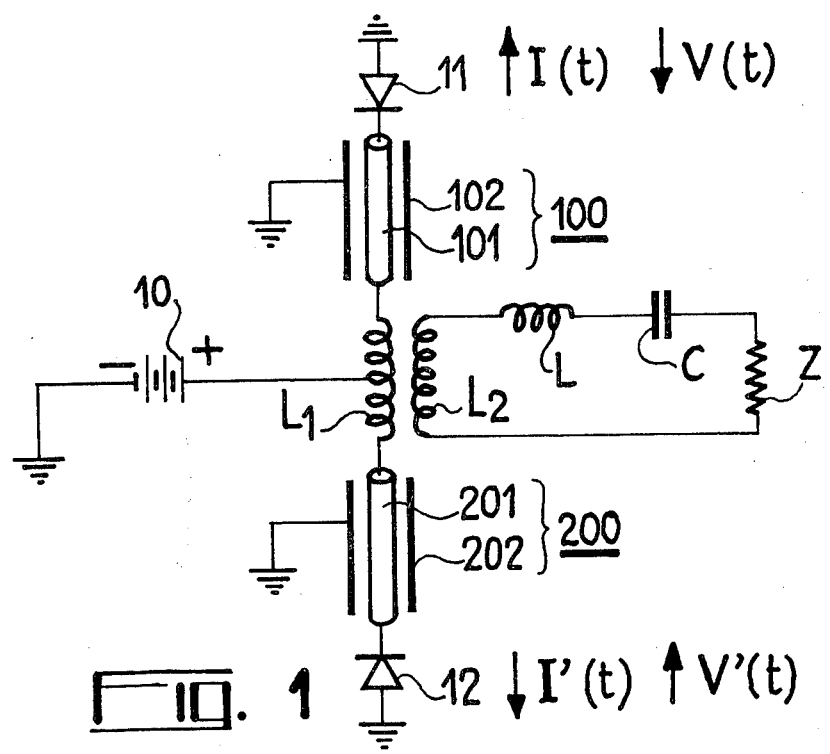
FIG. 1 is a diagram of a circit in accordance with the invention.

The diagram of FIG. 1 illustrates two diodes 11 and 12 of avalanche design, which exhibit a negative resistance in the X band (8.2 to 12.4 GHz) when reverse-biassed by a source 10. A similar diagram would be possible taking into account the features of other kinds of negative resistance semiconductor diodes, for example GUNN diodes. In the chosen example, the negative pole of the source 10 is earthed and the positive pole is connected to the electrodes (insulated from earth) of the diodes 11 and 12 through the medium of the central conductors 101 and 201 of two coaxial line sections 100 and 200 which are symmetrical in relation to a waveguide symbolised by a circuit of "L, C" kind with a load impedance Z. With the help of conventional symbols, coupled inductances $L_1$ and $L_2$ corresponding to magnetic coupling between coaxial line and wave-guide, have been shown.

As far as the operation of the circuit shown in FIG. 1 is concerned, the following remarks apply:

1. The two diodes are in series from the high frequency point of view and this eases matching of the circuit, in view of their low negative resistance (of the order of some few ohms);
2. The two diodes are in parallel from the d.c. point of view; and this facilitates decoupling of the supply as will be explained later on;
3. The two diodes are in parallel from the thermal point of view and this makes it possible to achieve simple (conventional) heat dissipation;
4. The special symmetry of the structure on the other hand implies the following property:

the power transmitted to the load only contains odd harmonics whilst the even harmonics are diverted to the d.c. supply side. In other words, if we call I (t) and I' (t) the currents flowing through the diodes 11 and 12 (with the sign convention corresponding to the arrows of FIG. 1), and similarly V (t) and V' (t) the voltages across the terminals of the diodes, then in the steady state situation we have $$I(t) = I_n e^{jn\omega t} \qquad (1)$$

$$I'(t) = I'_n e^{jn\omega t} \qquad (2)$$

where $n$ is a whole number varying from $-\infty$ to $+\infty$.

If the diodes are perfectly matched, then we have:

$$I'(t + T/2) = I(t)$$

where $T$ designates the periodicity of the high frequency current.

Substituting $t + T/2$ for T, we have, after calculation, the following equation:

$$I'_n = (-1)^n I_n$$

The voltage induced in the secondary of the circuit shown in FIG. 1 is proportional to the resultant current in $L_1$:

$$i_1(t) = I(t) - I'(t)$$

and from this it will readily be seen that the even harmonics have a zero coefficient; thus, we are simply left with the odd harmonics.

The current supplied by the bias source is given by:

$$i_2(t) = I(t) + I'(t)$$

and again we see that only the even harmonics are left.

In other words, (neglecting the harmonics of higher order than 2), impedance $Z(\omega)$ and $Z(2\omega)$ as seen from each diode, can be adjusted by means of two indepedent adjustments. In particular, if the centre point of $L_1$ is earthed for high frequencies, the impedance $Z(2\omega)$ is zero and no effective power is developed at the harmonic 2 (except for that possibly dissipated in the internal resistance of each diode).

It will be realised, too, that for perfectly matched diodes the decoupling of the bias source is unnecessary.

Finally, the diodes tend to spontaneously oscillate in antiphase, feeding a maximum power into the waveguide, the harmonic 2 being virtually completely eliminated.

Figure 2:
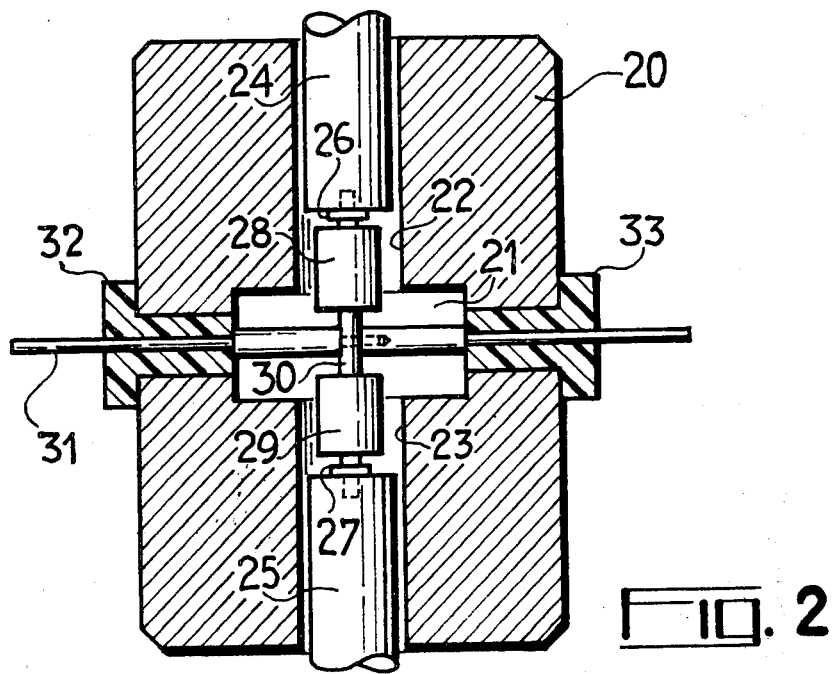
FIGS. 2 and 4 are schematic sections of embodiments of the invention.

In the embodiment of FIG. 2, a schematic illustration have been given of an electromagnetic cavity element 20 surrounding a wave-guide section 21 constituting the cavity proper.

Two chambers 22 and 23 are formed in the cavity walls and communicate with this cavity through holes opposite to each other in a right section.

Positioning elements 24 and 25 (partially illustrated) with a diameter which can be modified by the operation of a known kind of clamping device (not shown), are inserted into the chambers from the outside. These elements called "clamps" are provided at those of their ends disposed towards the cavity, with a flat into which a diode can be fixed by screwing its base into a thread (not shown). Diodes 26 and 27 are each applied against one end of a member constituted by two cylinders 28 and 29 of solid copper connected by an arm 30.

A shaft 31 does duty as a bias connection and supports the halter-shaped component during the assembly of the circuit. The shaft 31 is supported at each end of insulating, absorptive plugs. Using a circuit in accordance with that shown in FIG. 2 a microwave power of the order of 7 watts in the X band can be obtained, the dimensions being as follows:

cylinders 28 and 29: diameter 6 mm, height 7.5 mm;
chambers 22 and 23: 9mm diameter, 100 mm high;
arm 30: 2 mm diameter, 5 mm long;
shaft 31: 2 mm diameter (in the cavity).

Due to the symmetry of the circuit, it is possible to discard any decoupling between diodes and direct source; in particular, the discarding of any decoupling resistance in the d. c. voltage supply line makes it possible to increase the efficiency of the circuit considerably.

The circuit in accordance with the invention furthermore has the advantage that it can be modulated within quite a wide pass band by the bias voltage, since there are no decoupling elements to constitute any obstacle at the high frequencies (low-pass filter).

Figure 3:
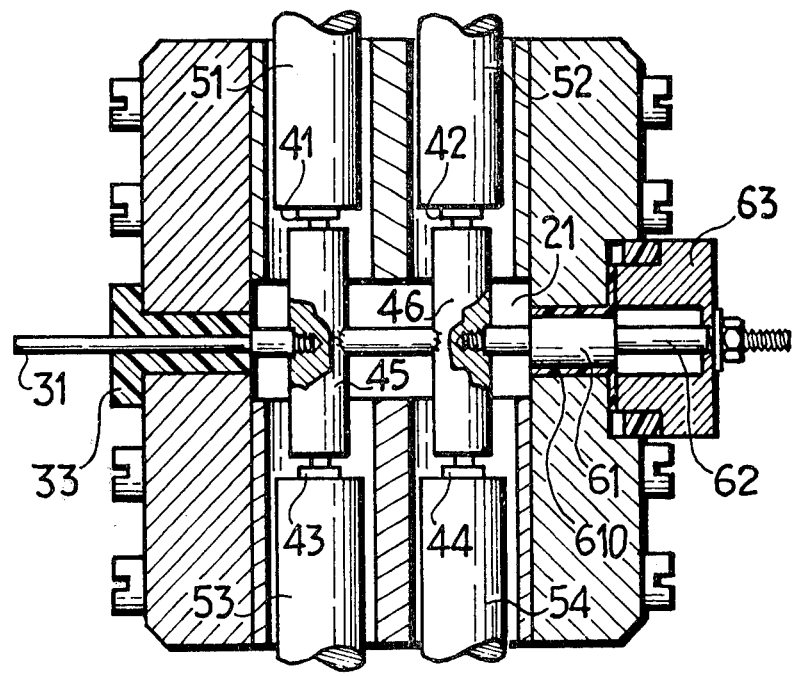
FIG. 3 is a schematic section of another embodiment of the invention, comprising two pairs of diodes.

In the embodiment shown in FIG. 3, a circuit example comprising four diodes arranged in pairs symmetrically vis-a-vis the shaft 31 (similar to that shown in FIG. 2), has been shown. The circuit constitutes a variant embodiment of the previous circuit. Once again there can be seen "clamps" 51, 52, 53 and 54, into which the bases of the diodes 41, 42, 43 and 44 are screwed. However, the cylinders 28 and 29 have been replaced by a single cylinder (for each pair of diodes), 45 or 46 respectively, of substantially identical diameter and length equivalent to that of the halter-shape component shown in FIG. 2. The shaft 31 can be dismantled into 3 sections assembled together by inserting them into one another as they pass through the cylinders 45 and 46. At the right-hand side of the figure, a two-stage trap constituted by two successive sections of coaxial line having different impedances, with a length equal to a quarter wave at the given wavelength, has been shown. The first section comprises a central conductor 61 of relatively large diameter, insulated from the central conductor by a polytetrafluoroethylene sleeve 610. The second section comprises a central conductor 62 of smaller diameter, with air-gap insulation. An insulating sleeve 63 holds the thinned end of the shaft 31 at the side adjacent the trap. The left-hand side of the drawing illustrates a plug 33 which is both an insulator and an absorber. In actuality, a completely symmetrical disposition is used, comprising a trap or a plug at either side.

Figure 4:
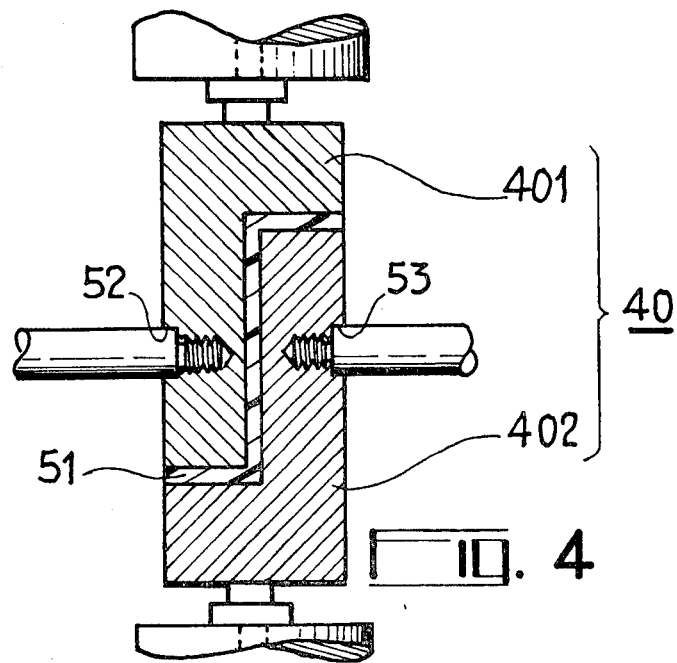

FIG. 4 illustrates a variant embodiment of the circuit shown in FIG. 2 in which a cylinder 40 replacing the cylinders 28 and 29 and the connecting arm 30, is split into two sections 401 and 402, connected at two surfaces with three faces, enclosing an insulating layer 51 (for example polytetrafluoroethylene). This splitting produces two half-shafts 52 and 53 which are screwed into locations at the centre of the cylinder 40. They are insulated as far as d.c. is concerned, and short-circuited for high frequency by the capacitance created between the surfaces of the two half-cylinders. In this case, slight mis-matching of the diodes of the circuit can be compensated for by an unbalance in the supply voltages.

Other variant features of the invention are as follows:
circuits in which the bias voltage is reversed in relation to the of FIG. 1, due to the type of diode used;
circuits in which the chambers containing the diodes are formed unsymmetrically.

What we claim is:

1. A negative-resistance microwave circuit comprising one wave-guide and at least a pair of chambers (22,23) with conductive walls forming a symmetrical arrangement in the right section plane (21) of said wave-guide, each chamber communicating with said wave-guide, and containing means (28, 29, 30) for supporting and polarizing a negative-resistance diode (26,27), said polarizing means forming with the walls of each chamber a coaxial line portion.

2. A circuit as claimed in claim 1 wherein said polarizing means comprises a member constituted by two cylinders (28,29) of solid metal connected by an arm (30).

3. A circuit as claimed in claim 2 wherein said member is connected to a shaft (31) placed across said wave-guide.

4. A circuit as claimed in claim 1 wherein said polarizing means comprises a solid metal cylinder (40) split into two sections (410, 402), an insulating layer (51) disposed between the two sections, and two half-shafts (52, 53) respectively fixed in each cylinder.

* * * * *